United States Patent [19]

Inoue

[11] Patent Number: 4,639,378

[45] Date of Patent: Jan. 27, 1987

[54] AUTO-SELECTIVE METAL DEPOSITION ON DIELECTRIC SURFACES

[75] Inventor: Kiyoshi Inoue, Tokyo, Japan

[73] Assignee: Inoue Japax Research Incorporated, Kanagawaken, Japan

[21] Appl. No.: 691,877

[22] Filed: Jan. 16, 1985

[30] Foreign Application Priority Data

Jan. 17, 1984 [JP] Japan .................. 59-6116
Jan. 17, 1984 [JP] Japan .................. 59-6117

[51] Int. Cl.[4] .................................................. B05D 3/06
[52] U.S. Cl. ............................... 427/35; 427/43.1; 427/306; 427/53.1
[58] Field of Search .................. 427/40, 306, 35, 36, 427/43.1

[56] References Cited

U.S. PATENT DOCUMENTS

| | | | |
|---|---|---|---|
| 2,690,402 | 9/1954 | Crehan | 427/306 |
| 3,436,468 | 4/1969 | Habereshy | 427/44 |
| 3,954,570 | 5/1976 | Shirk et al. | 427/306 |
| 4,165,394 | 8/1979 | Ehrbar et al. | 427/306 |
| 4,440,801 | 4/1984 | Aviram et al. | 427/306 |

Primary Examiner—John H. Newsome
Attorney, Agent, or Firm—Finnegan, Henderson, Farabow, Garrett & Dunner

[57] ABSTRACT

A method of plating a pattern of metal (e.g. copper or nickel) on a dielectric surface, i.e. surface of a dielectric material such as a synthetic resin or ceramic. The method comprises the preliminary step of masklessly treating the dielectric surface to selectively activate preselected areas thereof so that the dielectric surface in contact with a priming solution becomes catalytic, and thereby receptive to electroless metal deposition, selectively at those areas. The treated dielectric surface is contacted with an electroless plating solution to allow metal therefrom to auto-reductively deposit selectively at those catalized areas, thereby forming the pattern of metal desired on the dielectric surface.

6 Claims, 11 Drawing Figures

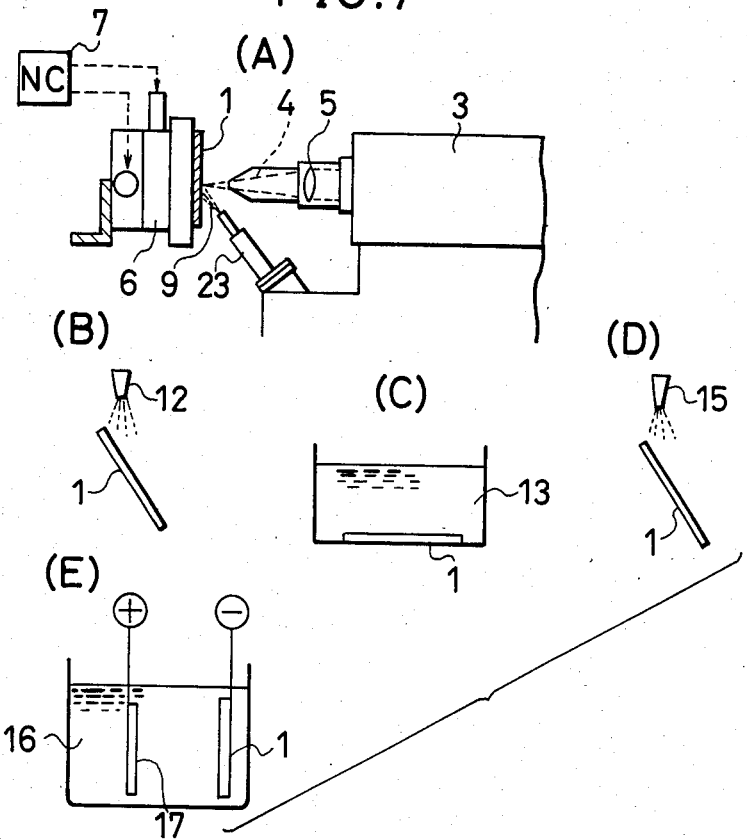
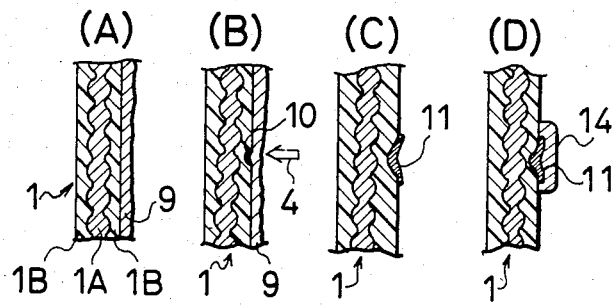

AUTO-SELECTIVE METAL DEPOSITION ON DIELECTRIC SURFACES

FIELD OF THE INVENTION

The present invention relates to selective or pattern plating on a dielectric substrate such as plastic, glass, synthetic resin or ceramic. More particularly, the invention relates to a method of plating a pattern of metal on a dielectric surface by utilizing selective but maskless chemical or electroless metal deposition.

BACKGROUND OF THE INVENTION

It is known that patterned or selective metal plating can be achieved by chemical or electroless (two terms are interchangeably used in the art) metal deposition in which masking is employed to delineate the patterns. While masking plating techniques provide finely delineated patterns of metal which are now extensively needed in the manufacture of, for example, electronic circuits on dielectric substrates, these processes are inefficient and costly. Besides they may impose serious restriction on the size of the pattern which can be batch-deposited.

In U.S. Pat. No. 4,239,789 to BLUM et al there is described a maskless chemical plating method in which a surface of a workpiece is contacted with an electroless plating solution and an energy beam such as laser beam is directed onto the workpiece to locally heat the surface to promote enhanced plating. According to the teachings of that patent, the plating substrate is a nickel film vapor-deposited on a glass work-piece. The argon laser beam is passed through a nickel electroless plating solution and illuminates selected regions of the surface of the nickel film in contact therewith. The beam alternatively is passed through both the solution and the glass base and illuminates the nickel-glass interface beneath such regions of the surface of the nickel film in contact with the nickel electroless plating solution. While it is taught that there occurs localized enhancement of electroless nickel plating at those regions, the data offered indicate that the process disclosed is rather a low plating rate and slow-yield process. Even more of significance, there is no indication that a dielectric substrate such as glass can be directly pattern-plated without masking. Thus, the teaching of the BLUM et al patent which requires on a dielectric workpiece a nickel film for electroless nickel pattern plating is not properly applicable where as contemplated by applicant here a given metal (such as nickel) is to be selectively plated on a dielectric substrate to provide a delineated pattern of the metal thereon.

OBJECTS OF THE INVENTION

An object of the present invention is to establish a maskless selective plating method which allows a pattern of metal to be electrolessly plated directly on a dielectric substrate.

Another object of the invention is to provide a method described which is capable of yielding high-resolution patterns of metal on a dielectric substrate or substrates at an enhanced plating rate or rate of yield.

SUMMARY OF THE INVENTION

According to the present invention there is provided a method of plating a pattern of metal on a dielectric surface, which method comprises the steps of: (a) masklessly treating the dielectric surface to selectively activate preselected areas thereof so that the dielectric surface when in contact with a priming solution becomes catalytic, and thereby receptive to electroless metal deposition, selectively at said preselected areas; and (b) contacting the treated dielectric surface with an electroless plating solution to allow metal therefrom to auto-reductively deposit selectively at said preselected, catalyzed areas, thereby forming the pattern of metal desired on the dielectric surface.

BRIEF DESCRIPTION OF THE DRAWINGS

These and other features of the present invention as well as advantages thereof will become more readily apparent from a reading of the following description when taken with reference to the accompanying drawings in which:

FIGS. 7(A)–7(E) are diagrammatic side views similar to those of FIGS. 1(A)–1(F), illustrating another method embodying the present invention;

FIGS. 8(A)–8(D) are diagrammatic views similar to those of FIGS. 2(A)–2(D) and given to aid in the understanding of the method of FIGS. 7(A)–7(E);

SPECIFIC DESCRIPTION

The chemical or electroless plating process is generally divided into the main stage in which a substrate is brought into contact with an electroless plating solution and the priming stage preliminary to the main stage. In the priming stage, the dielectric substrate is brought into contact with a priming solution, e.g. a palladium-chloride solution and/or a stannous-chloride solution which catalyzes the substrate prior to the electroless metal deposition, thus providing catalytic (nucleating) sites on the substrate surface which sites are receptive to the electroless metal deposition thereon, or on which sites the metal can be auto-catalytically or -reductively deposited. While it is possible to localize the area of catalyzing or activation and hence of electroless metal deposition by masking the substrate surface so that only that area is exposed to the priming solution, the masking entails laborious, time-consuming and expensive steps.

The selective plating method according to the present invention involves, as the step preliminary to the main, electroless plating step, the step of masklessly treating the di-electric surface to selectively activate preselected areas thereof so that the dielectric surface when in contact with the priming solution becomes catalytic, and thereby receptive to the electroless metal deposition, selectively at those preselected areas.

According to one embodiment of the present invention, in the preliminary step the dielectric surface is so treated as defined by exposing the dielectric surface to irradiation by an energy beam. This is in sharp contrast with the aformentioned BLUM et al process in which an energy beam is employed to irradiate the area contacted by the electroless plating solution and which requires the preliminary vapor deposition (naturally non-localized or, if to be localized, with a masking) of the same metal to be electrolessly deposited.

The energy beam is conveniently a focused beam of electromagnetic radiation and can be advantageously a laser beam, a beam of Xenon lamp, or a beam of microwaves (having a frequency in excess of 100 MHz/and preferably a frequency of 2678 MHz). The beam should have a power density in excess of $10^2$ watts/cm$^2$ and preferably not less than $10^3$ watts/cm$^2$ but not more than $10^6$ watts/cm$^2$.

Figure 1:
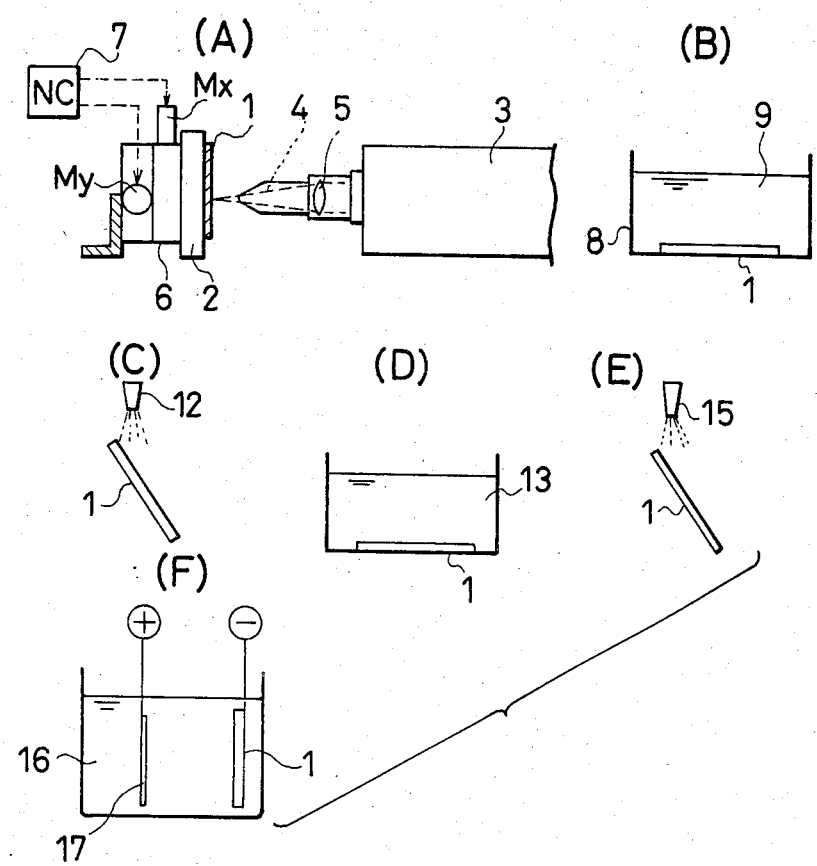
FIGS. 1(A)–1(F) are diagrammatic side views illustrating a method according to the present invention.
Figure 2:
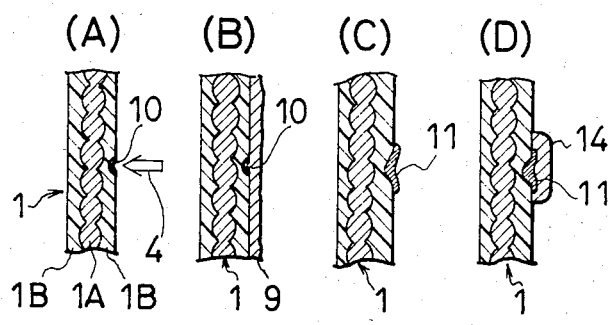
FIGS. 2(A)–2(D) are diagrammatic side-sectional views illustrating a course of the beam activation, the formation of an activation spot, the precipitation of a catalytic nucleus and the electroless deposition of a metal thereon to aid in the understanding of the method of FIGS. 1(A)–1(F)

Referring now to FIG. 1(A), a dielectric substrate 1 is shown as securely mounted on a vertical work support 2. A laser (e.g. argon laser) generator 3 produces a laser beam 4 focused through a lens system 5 to impinge on the surface of the dielectric substrate 1 with a power density of, e.g., $1.5 \times 10^3$ watts/cm$^2$ and with a beam spot diameter of, e.g., 1 mm. By displacing the beam 4 and the work support 3 relative to each other, the beam spot moves on a surface of the dielectric substrate 1, leaving behind a sharply delineated beam-treated area (line) of a width of 1 mm. In the arrangement illustrated, the laser generator 3 is fixed in position and the work support 2 is movably carried by a compound drive table 6 provided with a pair of motors Mx, My. The motors Mx and My are driven by drive command signals furnished from a numerical control (NC) unit 7 to displace the substrate 1 in a vertical or X-Y plane so that the trajectory of the beam spot on the surface of the substrate 1 follows a predetermined path programmed in the NC unit 7 to precisely cover preselected areas thereon and delineate a predetermined pattern to be later electrolessly plated with metal. Preferably, the dielectric substrate 1 and the beam 4 impinging thereon are placed in a vacuum or in a rarefield or otherwise clean atmosphere which may be filled with an inert gas. The substrate 1 prior to the beam treatment is washed with a neutral detergent, water-rinsed and dried. The dielectric substrate 1 may, for example, be a composite plate which is shown in FIG. 2 comprises a glass-fiber woven textile 1A having layers 1B of an epoxy resin coated thereon at both sides.

During the beam treatment operation described, each site of the dielectric surface irradiated with the focused beam 4 is highly activated. Not only does the beam irradiation or bombardment heat or thermally activate the irradiated or bombarded site in the usual sense but apparently it effectively removes and strips away moisture, adsorptive gaseous particles, thin oxide films and other impurities normally firmly adherent to and coated on the substrate of a dielectric substrate 1 such as a ceramic, synthetic resin or the like. As a result, it appears that on each treated site there develops a "naked" surface of the substrate which surface is highly chemically unstable or "excited". Such an activated site as formed on the dielectric surface is diagrammatically illustrated at 10 in FIG. 2(A).

When the entire preselected areas have been so treated, the treated substrate 1 is introduced into and immersed in the bath 8 of a priming solution 9 as shown in FIG. 1(B). The substrate 1 in contact with the priming solution 9 (FIG. 2(B)) then becomes catalytic, and develops precipitation nuclei, selectively at the activated sites 10. Such nuclei of catalytic precipitation as formed and left after removal of the solution 9 by water rinse on the dielectric substrate 3 is diagrammatically shown at 11 in FIG. 2(C).

The priming solution 9 may be a solution of palladium chloride and may be composed as tabulated in Table 1 below.

TABLE 1

| 0.25 to 12.5 g/l | $PdCl_2$ |
| 2.5 to 125 ml/l | 36% HCl |
| 0 to 200 ml/l | $C_3H_8O_3$ |
| Balance (base) | $C_2H_5OH$ |

After removal from the bath 8, the substrate 1 as shown in FIG. 1(C) is washed with chloric acid (e.g. of a 10% concentration) and then water-rinsed. Nozzles 12 are used to deliver chloric acid flowing over the substrate 1 down to remove the adherent priming solution therefrom and then to deliver water flowing over the substrate 1 down to remove the chloric acid therefrom.

After drying, the substrate 1 is introduced into and immersed in a bath of an electroless plating solution 13 as shown in FIG. 1(D). This will cause metal (e.g. copper or nickel) from the electroless plating solution 13 to auto-reductively or -catalytically deposit selectively at an activated, preselected areas of the dielectric surface of the substrate 1. FIG. 2(D) shows the metal 14 depositing on the activation (palladium) nucleus 11.

For copper electroless deposition, the solution 13 may be composed as tabulated in Table 2 below.

TABLE 2

| 7 g/l | copper sulfate |
| 20 g/l | Rochelle salt |
| 2 g/l | sodium carbonate |
| 5 g/l | sodium hydroxide |
| 25 ml/l | 40% aqueous solution of folmaldehyde |

For nickel electroless deposition, the solution 13 may be composed as tabulated in Table 3 below.

TABLE 3

| 45 g/l | nickel chloride |
| 11 g/l | sodium hypochlorite |
| 100 g/l | sodium citrate |
| 50 g/l | ammonium chloride |

After removal from the bath of the electroless plating solution 13, the substrate 1 is rinsed with water as shown in FIG. 1(E). A nozzle 15 is used to deliver water flowing over the substrate 1 down to remove the adherent electroless plating solution 13 therefrom.

Thereafter, the substrate 1 may optionally be introduced into and immersed in a bath of an electrodepositing solution 16 as shown in FIG. 1(F). An anode 17 is juxtaposed with the substrate 1 as the cathode of the bath in the electroplating solution 16 and a direct current is passed between the anode 17 and the cathode to electrodeposite the metal (e.g. copper or nickel) from the solution 16 selectively onto the electrolessly metal-deposited areas to increase the thickness of metal plating.

In the priming activation stage of FIG. 1(A), it has been found that relative to the substrate 1 the beam 4 can be displaced to trace the preselected areas at a rate of displacement as high as 180 m/min (3.0 m/sec) to enable the palladium nuclei 11 (FIG. 11) to be sufficiently formed selectively onto those areas of the substrate 1 when in contact with the palladium-chloride priming solution 9 in the step of FIG. 1(B). Once a predetermined pattern of the palladium precipitation is obtained in the step of FIG. 1(B), the length of time as required for the metal to be electrolessly plated onto that pattern will give rise to no practical problem. Indeed, the metal electroless deposition here proceeds simultaneously over the entire localized, activated areas to enable the pattern to be electrolessly plated quickly. Moreover, a number of substrates 1 undergoing the treatment up to the stage of FIG. 1(C) can be prepared and batch-processed simultaneously in contact with the electroless plating solution 13 in the step of FIG. 1(D). Alternatively, a number of substrates 1 undergoing the beam-activation treatment of FIG. 1(A) can be prepared and batch-processed simultaneously in contact with the priming solution 9 in the step of FIG. 1(B) and then through the step of FIG. 1(C) batch-processed simultaneously in contact with the electroless plating solution 13 in the step of FIG. 1(D).

Figure 3:
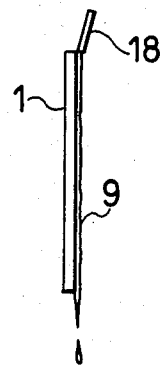
FIGS. 3–6 are diagrammatic side views illustrating various modified forms of applying the priming solution to the dielectric substrate to establish the required contact therebetween.

Referring to one example, the energy beam used in the step of FIG. 1(A) is a $CO_2$ laser beam having a beam diameter of 0.6 cm, a wavelength of 10.6 $\mu$m and a power of 10 watts. The priming solution 9 used in the step of FIG. 1(B) is an aqueous solution containing 0.1% by weight palladium chloride and 0.3% hydrogen chloride. The substate 1 pattern-activated by the energy beam 4 is exposed as shown in FIG. 3 to the priming solution 9 from a nozzle 18 flowing down at a flow rate of 1 cc/second and in a layer of 0.1 to 1 mm thickness over the substrate 1. The energy beam mentioned can be swept at a rate of displacement of 36 cm/min over preselected areas in the step of FIG. 1(A) to enable palladium to be quickly precipitated onto those areas in the step of FIG. 1(B). This means that the surface area which can be palladium-activated per minute is $0.6 \times 36 = 21.6$ cm$^2$/min. If the beam is focused to reduce its diameter to 0.06 cm (0.6 mm), the rate of displacement can be increased to $21.6 \div 0.06 = 360$ cm/min. If the power of the energy beam 4 is multiplied by ten, that is, increased to 100 watts, the displacement rate of the beam will also be ten times higher, that is, 3600 cm/min or 0.6 m/sec at maximum.

Figure 4:
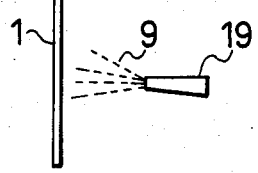
Figure 5:
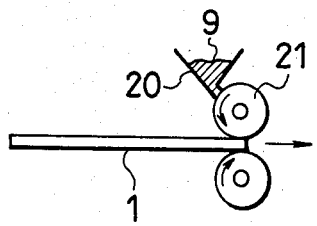
Figure 6:
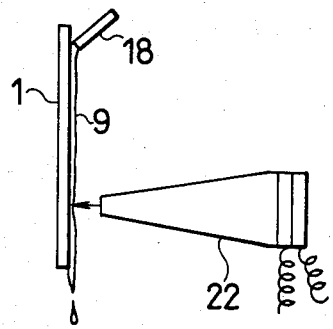

FIGS. 4-6 show further modified forms of applying the priming solution 9 to the beam-activated substrate 1 to establish contact therebetween. In FIG. 4, a nozzle 19 delivers the priming solution 9 in the form of a mist onto the locally beam-treated surface of the substrate 1. In FIG. 5, the priming solution 9 in the form of a paste is supplied from a receptacle 20 via a roller 21 onto the locally beam-treated surface of the substrate 1.

In the modification of FIG. 6, ultrasonic vibrations are imparted to the priming solution 9 in contact with the locally beam-treated surface of the substrate 1 to facilitate palladium precipitation thereon. In the arrangement illustrated, the substrate 1 lies extending vertically and the nozzle 18 delivers the priming solution 9 flowing down in a thin layer over the substrate 1 as previously shown in FIG. 3. An ultrasonic generator 22 is trained onto the substrate 1 to apply ultrasonic vibrations or waves of a frequency of 10 to 50 kHz to the priming solution flowing over the substrate 1. It has been found that the rate of precipitation can be doubled using the same power of the energy beam 4, or that the same rate of precipitation is achievable using the beam power one fourth lower.

It should be noted that the maskless activation of preselected areas of a dielectric substrate 1 can also be achieved in the step preliminary to electroless plating by mechanically or thermomechanically roughing the dielectric surface selectively along the preselected areas and thereafter bringing those areas into contact with the priming solution. The preselected areas can be successively roughed by tracing a rotating abrasive (e.g. diamond) tool in contact with the dielectric surface selectively along those areas. Alternatively, the preselected areas can be roughed by exposing the dielectric surface to a blast of abrasive or sand selectively along those areas. Alternatively, the preselected areas can be successively roughed by tracing an operating thermo stylus in contact with the dielectric surface selectively along those areas. It has been found that palladium tends to precipitate selectively onto the mechanically or thermomechanically roughed areas.

According to another embodiment of the present invention, in the preliminary step the dielectric surface is treated by exposing to irradiation by an energy beam the dielectric surface while in contact with the priming solution 9. Again, the energy beam is conveniently a focused beam of electromagnetic radiation and can be advantageously a laser beam, a beam of Xenon lamp, or a beam of microwaves as previously described.

FIG. 7(A), which represents a modification of the system of FIG. 1(A) and uses the same reference numerals to designate the same parts, elements and materials as previously described, shows a nozzle assembly 23 which directs a flow of the priming solution 9 onto the surface of the dielectric substrate 1 which is locally exposed to the laser beam 4. The dielectric substrate 1 can be a composite plate of a glass-fiber woven textile 1A sandwiched between layers 1B of an epoxy resin as shown in FIG. 8. Prior to the simultaneous beam and priming-solution treatment, the substrate 1 is washed with a neutral detergent, water-rinsed and dried.

During the treatment, the priming solution 9 can be delivered from the nozzle 23 at a flow rate of 50 ml/minute to form a flowing layer on the substrate 1 as shown in FIG. 8(A). The beam can be an argon laser beam focused by the lens system 5 to form a beam spot of a diameter of 1 mm at a power density of $1.5 \times 10^3$ watts/cm$^2$ on a preselected area of the dielectric surface in contact with the priming solution 9. The area irradiated with the energy beam 4 incident through the solution is activated to form a spot of activation 10 as shown at 10 in FIG. 8(B) and becomes selectively receptive to precipitation of a catalytic nucleus. Such nuclei selectively develop along areas swept by the energy beam 4 and remain along those areas as shown at 11 in FIG. 8 after removal of the solution 9 by washing, in the step of FIG. 7(B), the substrate 1 with chloric acid and then with water followed by drying as previously described. The substrate 1 is then introduced into and immersed in the bath of an electroless plating solution 13 as shown in FIG. 7(C) to allow metal 14 therefrom to auto-selectively deposit on the locally primed areas 11 as shown at 14 in FIG. 8(D) and previously described. After removal from the electroless plating bath 13, the pattern-plated substrate 1 is rinsed with water from the nozzle 15 as shown in FIG. 7(D). Thereafter, the substrate 1 can optionally be introduced into and immersed in the bath of an electrodepositing solution as shown in FIG. 7(E) and previously described to increase the thickness of metal pattern-plated.

In the priming activation stage of FIG. 7(A), it has been found that relative to the substrate the beam 4 can be swept or displaced to trace the preselected areas at a rate of displacement as high as 220 meters/minute (3.67 m/sec) to allow the precipitation nuclei 11 (FIG. 8(C)) to be sufficiently formed selectively on those areas of the substrate 1. Once a predetermined pattern of the catalytic precipitation is obtained in the step of FIG. 7(A), the length of time as required for the metal 14 to be electrolessly plated onto that pattern in the step of FIG. 7(C) will give rise to no practical problem. Indeed, the metal electroless deposition here proceeds simultaneously over the entire selectively primed areas to enable the pattern to be electrolessly plated quickly. Moreover, a number of substrates undergoing the priming treatment can be prepared and batch-processed simultaneously in the bath 13 in the step of FIG. 7(C).

Referring to one example, the energy beam 4 used in the step of FIG. 7(A) is a $CO_2$ laser beam having a beam diameter of 0.6 cm, a wavelength of 10.6 $\mu$m and a power of 10 watts. The priming solution 9 is an aqueous solution containing 0.1% by weight palladium chloride and 0.3% hydrogen chloride and is caused to flow at a flow rate of 1 cc/sec in a layer of a thickness of 0.1 to 1 mm over the substrate 1. The energy beam 4 can be swept at a rate of displacement of 44 cm/min to continuously develop the catalytic precipitation along the beam sweeping path. This means that the surface area which can be selectively catalyzed is $0.6 \times 44 = 26.4$ $cm^2$/min. If the beam is focused to reduce its diameter to 0.06 cm (0.6 mm), the rate of displacement can be increased to $26.4 \div 0.06 = 440$ cm/min. If the power of the beam energy is multiplied by ten, that is, increased to 100 watts, the displacement rate can also be ten times higher, that is 4400 cm/min or 0.7 m/sec.

Figure 9:
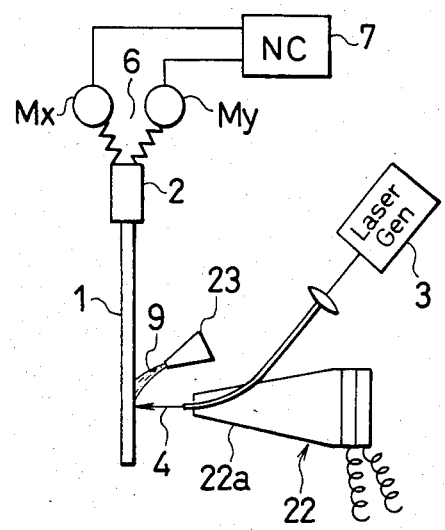
FIG. 9 is a diagrammatic side view illustrating a form of the simultaneous beam irradiation and priming-solution delivery which facilitates the catalytic activation of localized areas of a dielectric surface.

FIG. 9 shows an arrangement similar to that shown in FIG. 6 using a ultrasonic generator 22 which includes an amplifier horn 22a directed to the dielectric substrate 1 being selectively activated. The energy beam 4 from the laser generator 3 is here deflected to pass through an optical guide arranged through the amplifier horn 22a to impinge on selected area of the surface of the substrate 1 in contact with the priming solution 9. The substrate 1 lies standing vertically and the nozzle 23 delivers the priming solution flowing down in a thin layer over the substrate 1. The ultrasonic generator 22 is activated to apply ultrasonic vibrations or a beam of ultrasonic waves of a frequency of 10 to 50 kHz to the priming solution passing over the localized, laser irradiated area of the substrate 1. With the additional use of the ultrasonic solution activation, it has been found tha the rate of catalytic precipitation can be doubled using the same power of the laser beam 4, or that the same rate of catalytic precipitation is achievable using the beam power one fourth lower.

Figure 10:
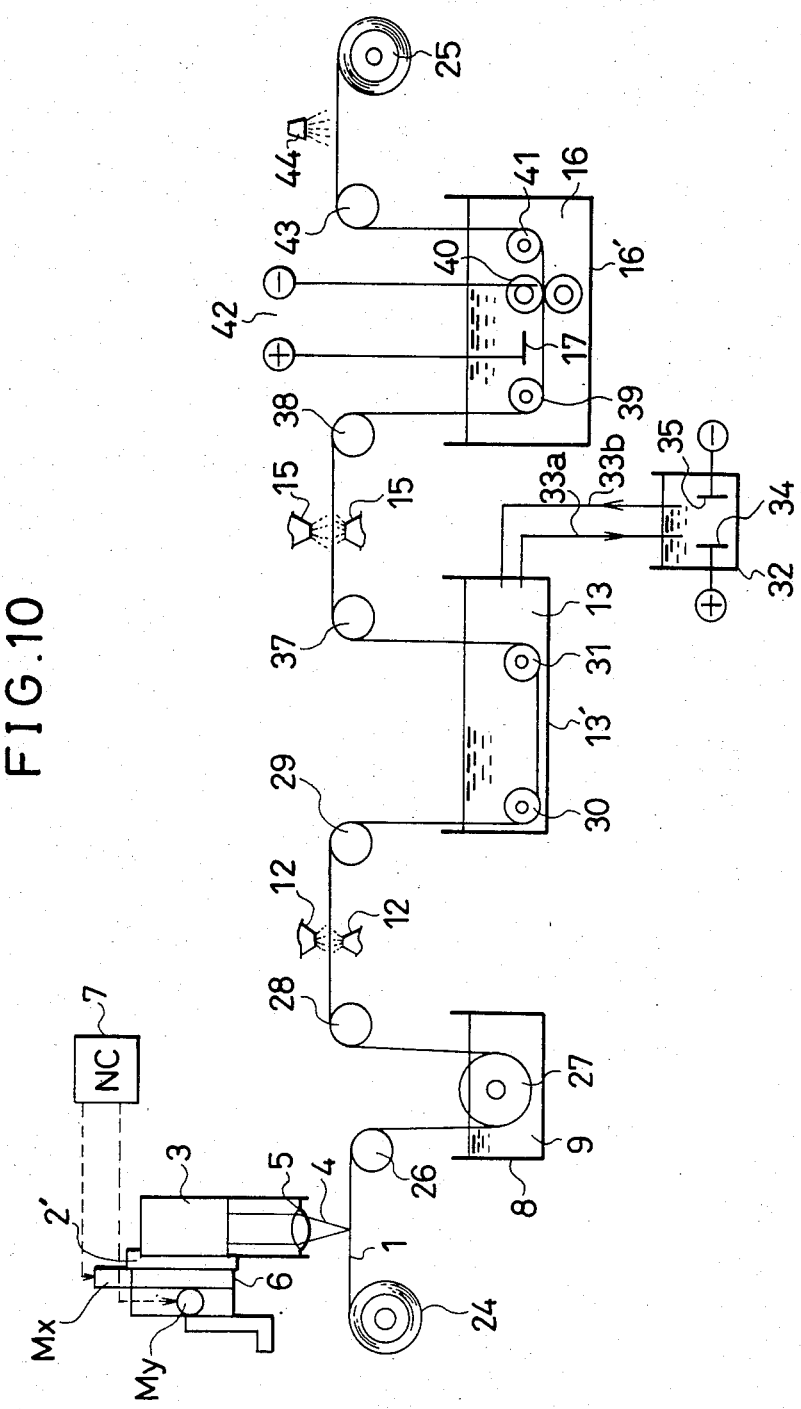
FIG. 10 is a diagrammatic view illustrating a continuous system for practicing one method according to the present invention.

FIG. 10 shows a continuous system embodying the present invention for continuously processing a dielectric substrate 1 which is in the form of a band dispensed from a supply drum 24 and wound on a takeup drum 25. The dielectric band 1 from the supply drum 24 prior to entry into the bath 8 of a priming solution 9 is activation-treated by being exposed to irradiation by a laser beam 4 from the laser generator 3. The latter directing the energy beam 4 onto the slowly moving dielectric surface 1 is here securely mounted on a carriage 2' which is in turn movably carried on a compound drive table 6 provided with a pair of motors Mx, My. The motors Mx and My are driven by drive command singles furnished from a numerical control (NC) unit 7 to translationally displace the energy beam in a horizontal plane so that the trajectory of the beam spot on the surface 1 follow a predetermined path programmed in the NC unit 7 to precisely cover preselected areas thereon and to delineate a predetermined pattern to be electrolessly plated with metal.

The dielectric band 1 then passes over a guide roller 26 to enter into the bath 8 of the priming solution 9 to allow the beam-irradiated, preselected areas to be autoselectively catalyzed upon contact with the solution 9. The band 1 passing over a guide roller 27 in the bath 8 is then guided over a cleaning stage defind between a pair of guide rollers 28 and 29 and where it is thoroughly rinsed with water from nozzles 12 removing any residue of the priming solution adherent thereon. The band 1 passing over the guide roller 29 is introduced into the bath 13' of an electroless plating solution 13 and moves over guide rollers 30 and 31 therein to allow metal (e.g. copper or nickel) from the solution to autoselectively deposit reductively on the catalyzed areas to form the desired pattern of metal on the dielectric surface 1. To replenish the plating metal and maintain the concentration thereof in the solution 13, an electrochemical bath 32 is arranged to communicate with the bath 13' via a pair of conduits 33a and 33b. The bath 32 has an anode 34 and a cathode 35 electrically energizable by an external power so that when these electrodes 34 and 35 are energized, the metal is electrolytically dissolved into the solution to replenish the metal therein.

Moving out of the electroless plating bath 13', the band 1 is guided between a pair of further rollers 37 and 38 and in a region therebetween is thoroughly rinsed with water delivered from nozzles 15. The band 1 is then guided to enter into the bath 16' of an electroplating solution 16 to pass over guide roller 39, 40 and 41 therein. The roller 40 which is electrically conductive is electrically connected to the negative terminal of an electroplating power source 42 and an anode 17 which is positioned adjacent the moving band 1 in the solution 16 is electrically connected to the positive terminal of the power source 42. The anode 17 and the cathodic roller are energized by the source 42 to allow the metal from the solution 16 to be electrodeposited on the previously, electrolessly deposited metal (conductive) pattern on the dielectric substrate 1 to increase the metal thickness of the pattern. Passing out of the electroplating bath 16', the band 1 is guided over a further roller 43 and rinsed with water from a nozzle 44 followed by drying prior to winding on the takeup roller 25.

Figure 11:
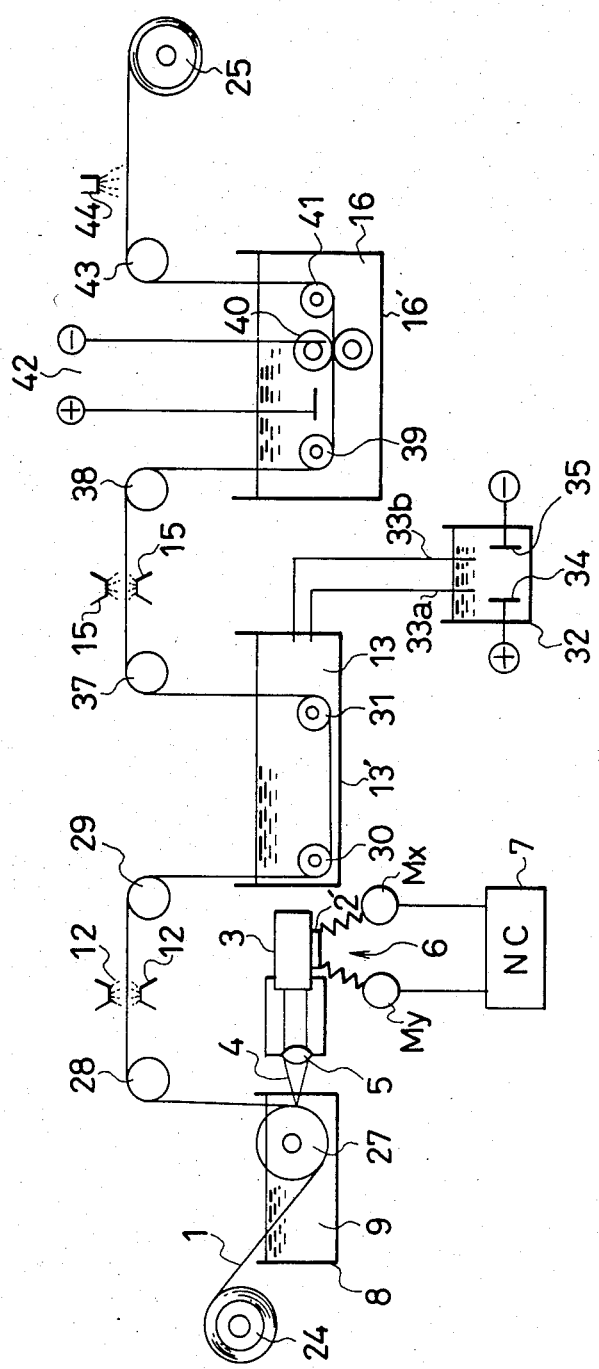
FIG. 11 is a similar view illustrating a continuous system for practicing another method according to the present invention.

FIG. 11 shows another continuous system which can be considered as a modification of the system of FIG. 10. In the system of FIG. 11 in which the same reference numerals are used to designate the same components, elements and materials, the band 1 is subjected to irradiation by the energy beam 4 when moving through the bath 8 of the priming solution. Thus, the dielectric band 1 unwound from the supply drum 24 is passed through the priming solution 9 and over the guide roller 27 to move out of the bath 8. The laser generator 3 is securely mounted on the carriage 2' which is here movable horizontally or in an X-Y plane. The energy beam 4 from the generator 3 passes through a transparent wall of the walls of a receptacle defining the bath 8' and through the priming solution 9 retained therein and is focused by the lens system 5 to form a narrow beam spot on a selected region of the dielectric substrate 1 in contact with the priming solution. Here again, the carriage 2' is movable by the compound drive table 6 with the X-axis and Y-axis motors Mx and My. These motors are driven by command signals from the NC unit 7 to sweep the laser beam 4 in an vertical plane on the substrate 1 so that the trajectory of the beam spot on the surface 1 follows a predetermined path programmed in the NC unit 7 to precisely cover preselected areas thereon and to allow these areas in contact with the priming solution to be selectively activated and catalized.

The priming solution 9 can be a palladium-chloride solution composed as tabulated in Table 4 below.

TABLE 4

| 3.3 grams | KCl |
|---|---|
| 2 grams | PdCl |
| 25 ml | 36% HCl |
| 1 l | H$_2$O |

The priming solution may also be a stannous-chloride solution composed as tabulated in Table 5 below.

TABLE 5

| 25.2 grams | SnCl$_2$.H$_2$O |
|---|---|
| 2.5 grams | KCl$_2$ |
| 25 ml | 36% HCl |
| 1 l | H$_2$O |

For nickel plating, the electroless plating soluton 13 can be composed as tabulated in Table 6 below.

TABLE 6

| 0.2 M | sodium citrate |
|---|---|
| 0.5 M | boric acid |
| 0.2 M | sodium hypochloride |
| 0.1 M | nickel sulfate |

PH: 8, Temperature: 70° C.

For copper plating, the electroless plating solution 13 can be composed as tabulated in Table 7 below.

TABLE 7

| 0.3 M | folmaldehyde |
|---|---|
| 0.1 M | copper sulfate |

PH: 11, Temperature: 25° C.

The dielectric surface 1 can, for example, be composed of ABS (acrylonitrile butadiene styrene), polypropylene, epoxy, polyester, phenol, polyphenyl oxide, polyvinyl, urethane or acryl resin, silicon, glass, silica or alumina.

What is claimed is:

1. A method of plating a pattern of metal on a dielectric surface, comprising the steps of:
    (a) masklessly treating the dielectric surface to selectively activate preselected areas thereof while said preselected areas are in contact with a priming solution so that the dielectric surface in contact with the priming solution becomes catalytic, and thereby receptive to electroless metal deposition, selectively at said preselected areas; and
    (b) contacting the treated dielectric surface with an electroless plating solution to allow metal therefrom to auto-reductively deposit selectively at said preselected catalyzed areas, thereby forming the pattern of metal desired on the dielectric surface.

2. The method according to claim 1 wherein in step (a) the dielectric surface is so treated as defined by successively exposing the dielectric surface to irradiation by an energy beam selectively along said preselected areas.

3. The method according to claim 1 or 2 wherein said priming solution comprises a solution of palladium chloride.

4. The method according to claim 1 or 2 wherein said priming solution comprises a solution of stannous chloride.

5. The method according to claim 1 or 2 wherein said priming solution comprises a combination of solutions of palladium chloride and stannous chloride.

6. The method according to claim 1 or 2, further comprising the step of (c) electrodepositing metal on the pattern of metal formed on the dielectric substrate in step (b) to increase the thickness of the metal thereof.

* * * * *